(12) United States Patent
Wang

(10) Patent No.: US 8,430,998 B2
(45) Date of Patent: *Apr. 30, 2013

(54) SPUTTERING APPARATUS

(75) Inventor: Chung-Pei Wang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 254 days.

This patent is subject to a terminal disclaimer.

(21) Appl. No.: 12/891,817

(22) Filed: Sep. 28, 2010

(65) Prior Publication Data

US 2011/0266146 A1  Nov. 3, 2011

(30) Foreign Application Priority Data

Apr. 29, 2010 (TW) .................................. 99113725

(51) Int. Cl.
 *C23C 14/00* (2006.01)
 *C25B 11/00* (2006.01)
 *C25B 13/00* (2006.01)

(52) U.S. Cl.
 USPC ................................ 204/298.15; 204/298.25

(58) Field of Classification Search ............. 204/298.15, 204/298.25
 See application file for complete search history.

(56) References Cited

U.S. PATENT DOCUMENTS

| | | | | |
|---|---|---|---|---|
| 2,847,325 | A | * | 8/1958 | Riseman et al. ............. 427/101 |
| 2,993,723 | A | * | 7/1961 | Twachtman et al. ......... 294/65.5 |
| 5,961,798 | A | * | 10/1999 | Robinson et al. ........ 204/298.25 |
| 6,013,162 | A | * | 1/2000 | Kobayashi et al. ...... 204/298.03 |
| 6,471,837 | B1 | * | 10/2002 | Hans et al. ............... 204/298.41 |
| 2009/0145745 | A1 | * | 6/2009 | Boling et al. ............ 204/192.13 |
| 2011/0253523 | A1 | * | 10/2011 | Wang ......................... 204/192.1 |
| 2011/0259740 | A1 | * | 10/2011 | Ling ........................ 204/298.15 |
| 2011/0266144 | A1 | * | 11/2011 | Wang ....................... 204/298.09 |

* cited by examiner

*Primary Examiner* — Keith Hendricks
*Assistant Examiner* — Ibrahime A Abraham
(74) *Attorney, Agent, or Firm* — Altis Law Group, Inc.

(57) ABSTRACT

A sputtering apparatus includes a preheating chamber, a deposition chamber, a passage in communication with the preheating chamber and the deposition chamber, a first support assembly received in the preheating chamber, a second support assembly received in the deposition chamber, a number of posts capable of mounting on each of the first and second support assemblies, a transferring robot arranged in the preheating chamber, and a magnetic assembly fixed on the transferring robot. The transferring robot is configured for demounting the post from the two support assemblies, transferring the demounted post between the preheating chamber and the deposition chamber, and mounting the transferred post on the two support assemblies. The magnetic assembly is configured for collecting iron workpieces dropped on a bottom in the preheating chamber, the deposition chamber, or the passage.

10 Claims, 9 Drawing Sheets

SPUTTERING APPARATUS

BACKGROUND

1. Technical Field

The present disclosure relates to coating technologies and, particularly, to a sputtering apparatus.

2. Description of Related Art

A sputtering apparatus for coating workpieces, includes a preparation chamber, a deposition chamber, two support assemblies respectively positioned in the preparation chamber and the deposition chamber, and a number of posts for fixing the workpieces. The posts are transferred from the preparation chamber to the deposition chamber and are mounted on the respective support assembly. However, during the transferring process, the workpieces are easily touched and dropped off from the posts. Only if a coating process is finished or broken off, can the workpieces be removed from the sputtering apparatus and fixed on the posts for a next coating process. This is time-consuming and decreases the efficiency of the coating process.

Therefore, what is needed is a sputtering apparatus which can overcome the described limitations.

DETAILED DESCRIPTION

Figure 1:
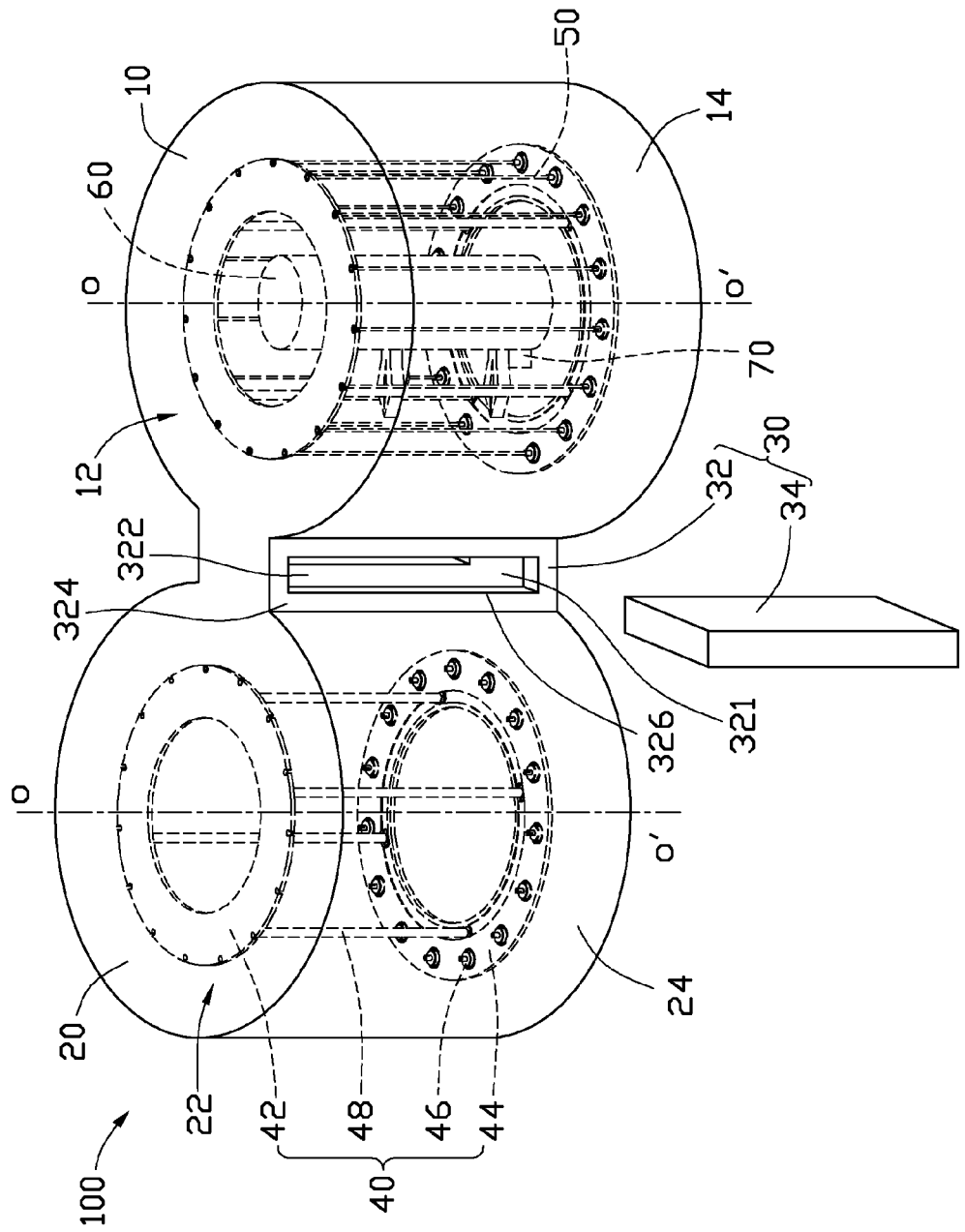
FIG. 1 is a schematic, isometric view of a sputtering apparatus including two rotatable assemblies and a transferring robot, according to a first exemplary embodiment, showing the transferring robot in a first state.
Figure 2:
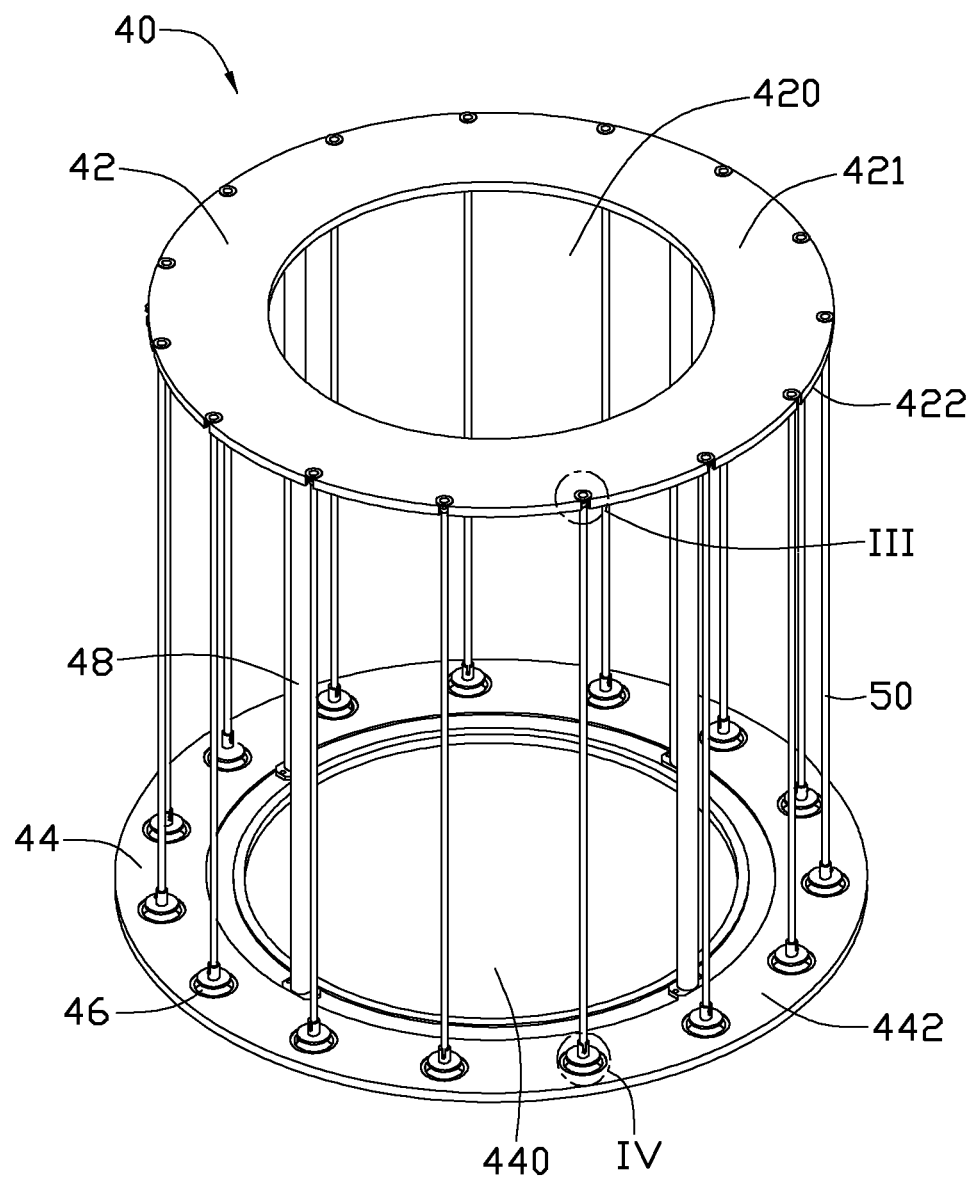
FIG. 2 is a schematic, isometric view of the rotatable assembly with posts of FIG. 1
Figure 3:
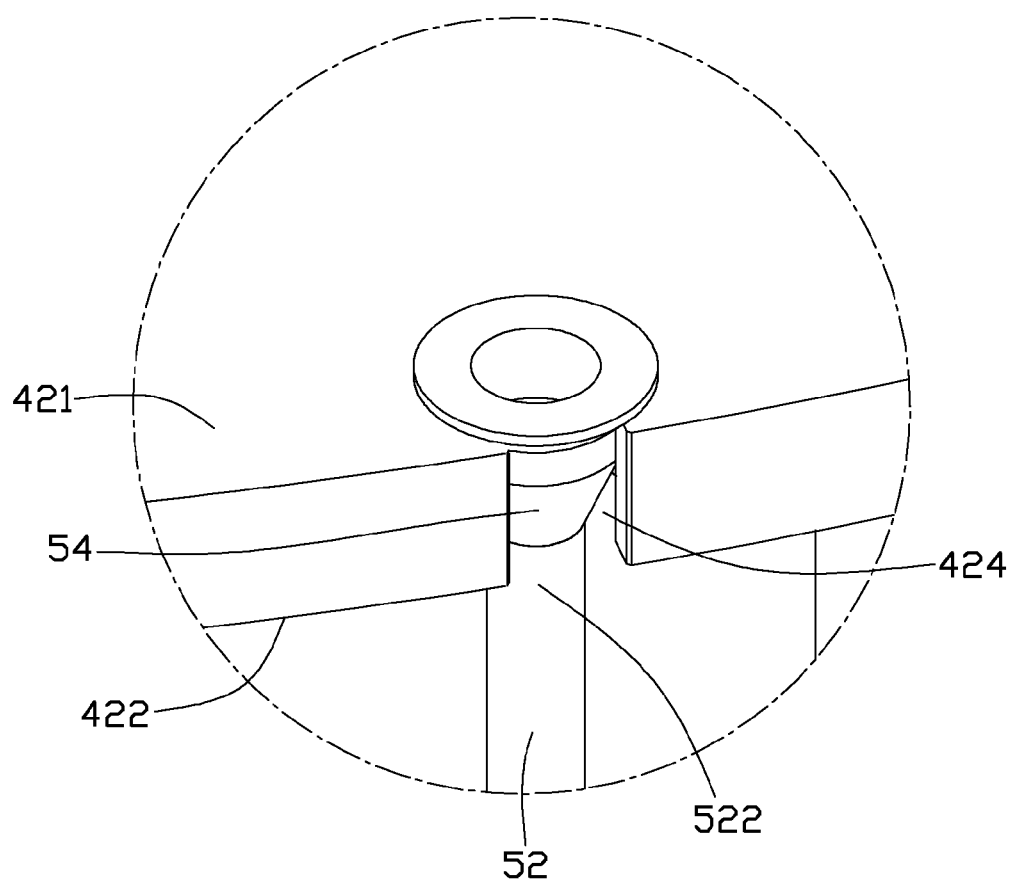
FIG. 3 is an enlarged view of a circled part III of the rotatable assembly of FIG. 2.
Figure 4:
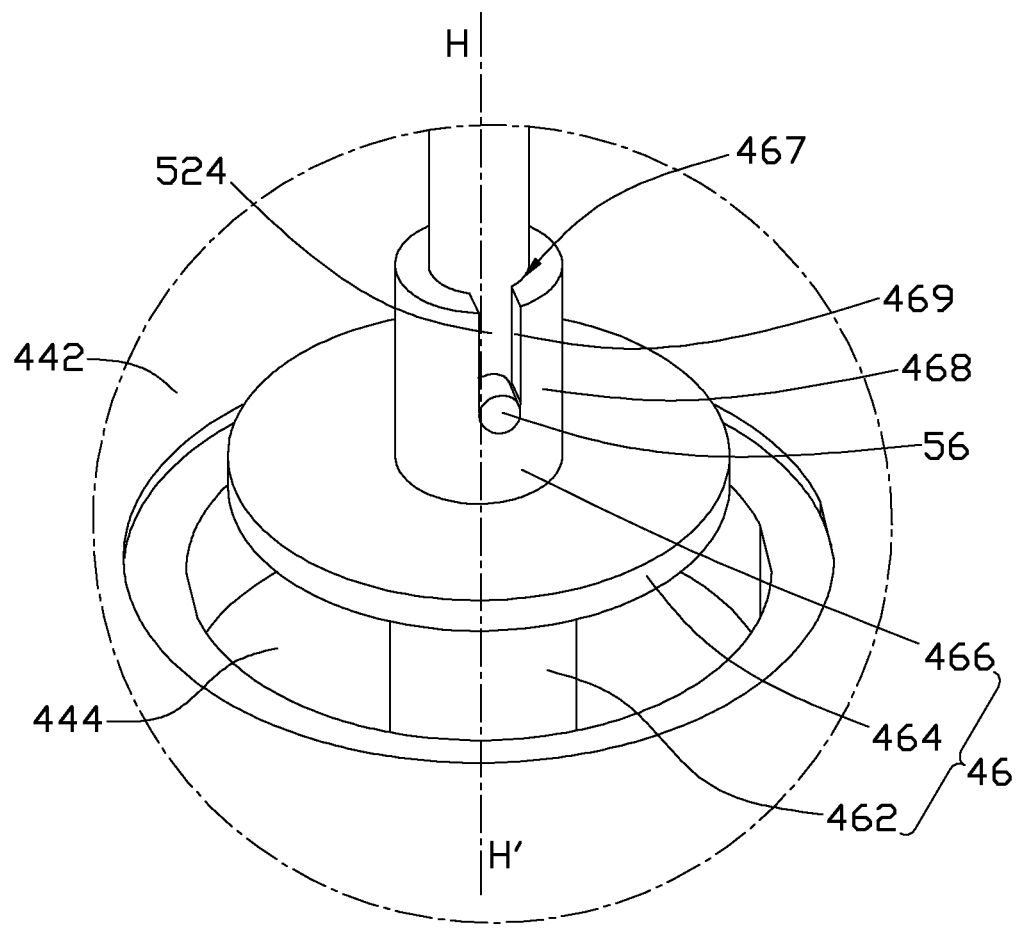
FIG. 4 is an enlarged view of a circled part IV of the rotatable assembly of FIG. 2.
Figure 5:
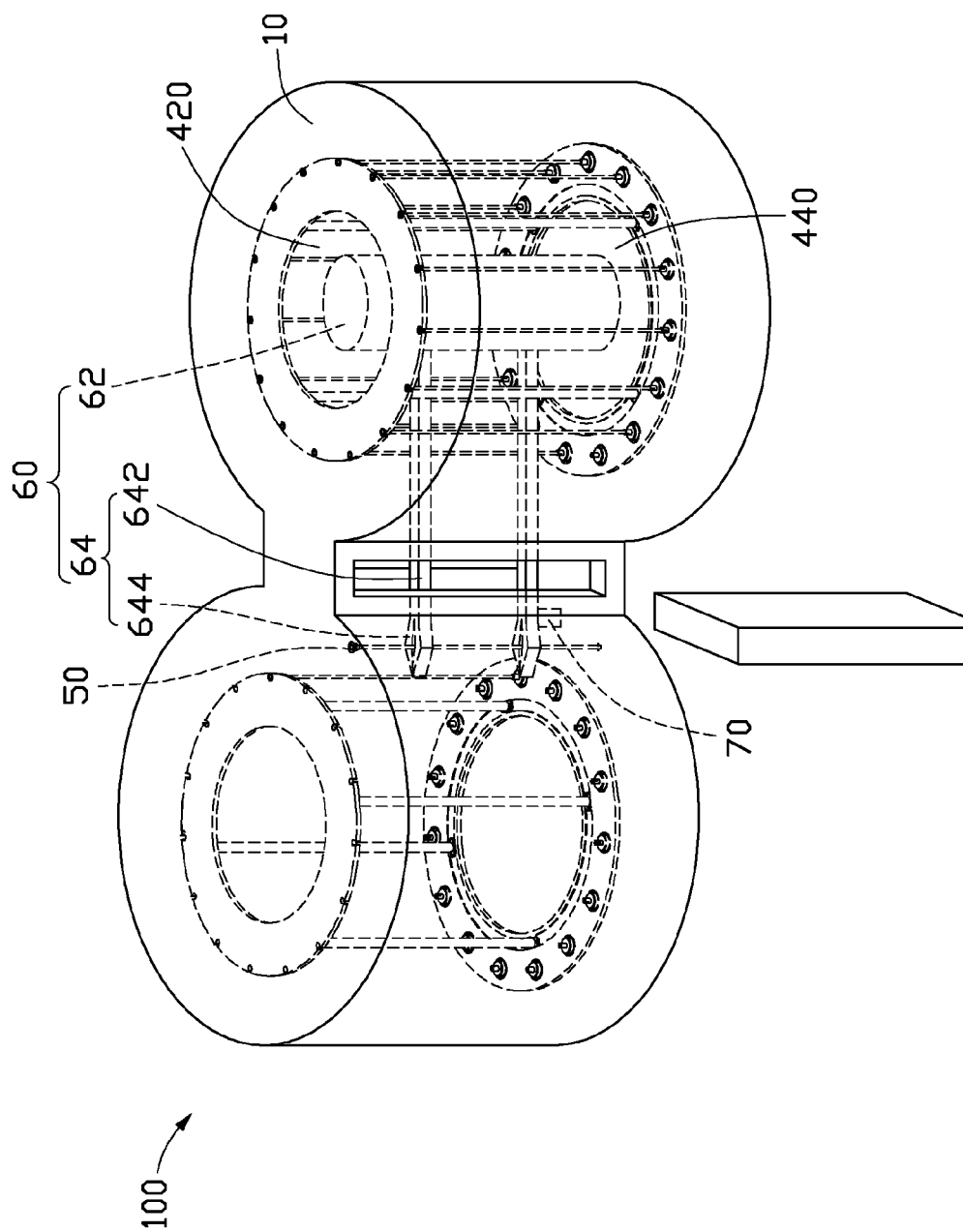
FIG. 5 is similar to FIG. 1, but showing the transferring robot in a second state.

Referring to FIG. 1, a sputtering apparatus 100 for coating a number of iron workpieces (not shown), according to a first exemplary embodiment, includes a preheating chamber 10, a deposition chamber 20, a connection assembly 30, two support assemblies 40, a number of posts 50, a transferring robot 60, and a magnetic assembly 70.

The structure of the preheating chamber 10 is the same as that of the deposition chamber 20 in this embodiment. The preheating chamber 10 defines a preheating cavity 12 and includes a first bottom 14. The deposition chamber 20 defines a deposition cavity 22 and includes a second bottom 24. The connection assembly 30 includes a connection member 32 and a partition plate 34. The connection member 32 connects the preheating chamber 10 to the deposition chamber 20. The connection member 32 defines a passage 322 having a third bottom 321. The passage 322 communicates with the preheating cavity 12 and the deposition cavity 22. The partition plate 34 is moveably coupled to the connection member 32 and configured for selectively closing or opening the passage 322. In this embodiment, the connection member 32 is substantially cuboid and includes four sidewalls. An opening 326 is defined in a sidewall 324 of the connection member 32. The partition plate 34 conforms to the opening 326 and the passage 322. The partition plate 34 extends through the opening 326 and is received in the passage 322 in an airtight manner. The passage 322 is sealed and divided into two sub-passages (not shown) by the partition plate 34. That is, the preheating cavity 12 is isolated from the deposition chamber 20 by the partition plate 34.

The two support assemblies 40 have the same structure. One support assembly 40 (the first support assembly) is received in the preheating cavity 12, and the other support assembly 40 (the second support assembly) is received in the deposition cavity 22. Each support assembly 40 defines a central axis OO' thereof. The support assembly 40 is rotatable about the central axis OO'.

Referring to FIGS. 2-5, the support assembly 40 includes an upper base 42, a lower base 44, a number of seat members 46 corresponding to the posts 50, and four connection posts 48.

The upper base 42 is an annular planar plate and defines an upper through hole 420 at a center thereof. The upper base 42 includes a first surface 421 and a second surface 422. The first surface 421 and the second surface 422 are at opposite sides of the upper base 42. A number of cutouts 424 through the first surface 421 and the second surface 422 are defined on a peripheral edge of the upper base 42 opening toward a direction away from the central axis OO'. The cutouts 424 substantially taper away from the upper through hole 420. The diameter of each cutout 424 decreases from the first surface 421 to the second surface 422. In this embodiment, the cutouts 424 are equidistant around the central axis OO'.

The lower base 44 is an annular planar plate and defines a lower through hole 440 aligned with the upper through hole 420. The lower base 44 includes a third surface 442 opposite to the second surface 422. A number of first receiving holes 444 are defined in the third surface 442 aligned with the cutouts 424 and corresponding to the seat members 46.

Each seat member 46 is rotatably received in a corresponding first receiving hole 444. Each seat member 46 includes a support post 462, a support base 464, and a cylindrical engagement post 466. The support post 462 is received in a corresponding first receiving hole 444. The support post 462 and the engagement post 466 are aligned with each other and extend from opposite sides of the support base 464. Each seat member 46 is rotatable about a longitudinal axis HH' of the support post 462. The engagement post 466 includes a second receiving hole 467, a sidewall 468 surrounding the second receiving hole 467, and a slot 469 defined in the sidewall 468.

The four connection posts 48 are interconnected between the second surface 422 and the third surface 442. The four connection posts 48 are spaced from the cutouts 424 and the first receiving holes 444. In this embodiment, the four connection posts 48 are equidistant around the central axis OO'.

The posts 50 are capable of mounting on the support assembly 40 and are configured for fixing the workpieces thereon. Each post 50 includes a rod body portion 52, an engagement portion 54, and a protrusion 56. The rod body portion 52 is a cylinder and includes a first end 522 and a second end 524 conforming to the second receiving hole 467. The first end 522 and the second end 524 are at opposite sides of the rod body portion 52. The engagement portion 54 extends from the first end 522 along the longitudinal axis of the rod body portion 52. The size of the engagement portion 54 is greater than that of the rod body portion 52. The diameter of the rod body portion 52 is less than that of the least diameter of the cutout 424. The engagement portion 54 has a tapered section conforming to the cutout 424. The protrusion 56 extends radially from the second end 524 conforming to the slot 469.

When a post 50 is mounted on the support assembly 40, the post 50 is lifted to raise the engagement portion 54 above the first surface 421, elevate the second end 524 above the engagement post 466, and align the protrusion 56 with the slot 469. The post 50 is then moved toward the third surface 442 until the engagement portion 54 engages in the cutout 424 and the second end 524 is received in the second receiving hole 467 and the protrusion 56 engages in the slot 469. Thus, the engagement portion 54 is positioned by the cutout 424 and the second end 524 is positioned in the seat member 46 through the protrusion 56 being blocked by the slot 469. As a result, the post 50 can rotate about the longitudinal axis HH' with the rotation of the seat member 46. When the post 50 is demounted from the support assembly 40, the post 50 is lifted to raise the engagement portion 54 above the first surface 421 and to elevate the second end 524 above engagement post 466. The post 50 is then radially moved away from the central axis OO' to separate from the support assembly 40.

The transferring robot 60 includes a receiving case 62, a driving member (not shown), and two manipulators 64. The receiving case 62 is positioned in the preheating chamber 10 and passes through the upper through hole 420 and the lower through hole 440. The driving member is received in the receiving case 62. Each manipulator 64 includes an arm 642 and a clamp 644 arranged on the arm 642. The arms 642 are received in the receiving case 62, and the clamps 644 are exposed at the receiving case 62. The driving member is mechanically and electrically connected to the manipulators 64. When the driving member is implemented, the arms 642 protrude out of, or retract into the receiving case 62. The arms 642 can also move up or down and the clamps 644 grip a post 50. In this embodiment, the arms 642 are extendable or retractable along a direction perpendicular to the central axis OO', and the arms 642 are moveable along the central axis OO' direction. The manipulators 64 are configured for demounting the post 50 from the support assembly 40 in the preheating chamber 10, transferring the demounted post 50 from the preheating chamber 10 to the deposition chamber 20, mounting the transferred post 50 on the support assembly 40 in the deposition chamber 20, demounting the post 50 from the support assembly 40 in the deposition chamber 20, transferring the demounted post 50 from the deposition chamber 20 to the preheating chamber 10, and mounting the transferred post 50 on the support assembly 40 in the preheating chamber 10.

The magnetic assembly 70 is a permanent magnet and fixed on an arm 642 adjacent to the first bottom 14. During the transferring process, the iron workpieces are easily touched and dropped on the first bottom 14, the second bottom 24 and the third bottom 321. The magnetic assembly 70 is configured for collecting the dropped iron workpieces to the arm 642. In this embodiment, the magnetic assembly 70 does not influence the iron workpieces fixed on the posts 50.

A sputtering method for coating a number of iron workpieces (not shown) can be implemented by, for example, the sputtering apparatus 100 and includes the following steps. The iron workpieces are placed in the preheating chamber 10. In particular, after the iron workpieces are fixed on the posts 50, the posts 50 are mounted on the support assembly 40 in the preheating chamber 10. Each post 50 is manually or automatically lifted to elevate the engagement portion 54 above the first surface 421, raise the second end 524 above the engagement post 466, and align the protrusion 56 with the slot 469. The post 50 is then moved toward the third surface 442 until the engagement portion 54 engages in the cutout 424 and the second end 524 is received in the second receiving hole 467 and the protrusion 56 engages in the slot 469.

The preheating chamber 10 is evacuated. In particular, air from the preheating chamber 10 is evacuated by a vacuum pump (not shown).

The preheating chamber 10 is heated. In particular, the iron workpieces therein are preheated by a heater (not shown). In this step, the support assembly 40 in the preheating chamber 10 rotates about the central axis OO' and the posts 50 rotate about the longitudinal axis HH' with the rotation of the seat member 46.

The posts 50 are transferred from the preheating chamber 10 to the deposition chamber 20 through the passage 322 and mounted on the support assembly 40 in the deposition chamber 20. In particular, the clamps 644 clamp a post 50 in the preheating chamber 10. The arms 642 move up along the central axis OO' direction until the engagement portion 54 is above the first surface 421 and the second end 524 is above the engagement post 466. The arms 642 protrude out of the preheating chamber 10 and enter the deposition chamber 20 to correspond to the support assembly 40 therein. The arms 642 finally move down along the central axis OO' direction until the engagement portion 54 engages in the cutout 424 and the second end 524 is received in the second receiving hole 467 and the protrusion 56 engages in the slot 469. The clamps 644 release the post 50 and the arms 642 retract into the receiving case 62 for transferring the next post 50. Operations are thus repeated until all posts 50 are transferred from the preheating chamber 10 to the deposition chamber 20.

The passage 322 is closed to isolate the preheating cavity 12 from the deposition cavity 22. In particular, the partition plate 34 extends through the opening 326 and is received in the passage 322 in an airtight manner so that the passage 322 is sealed and is divided into two sub-passages (not shown) by the partition plate 34.

The deposition chamber 20 is evacuated. In particular, air is evacuated from the deposition chamber 20 by a vacuum pump (not shown).

The iron workpieces are coated in the deposition chamber 20 using a sputtering process. In particular, an inert gas is introduced in the deposition chamber 20 to excite energized ions. The energized ions bombard a solid target material (not shown) to vaporize the material. The vaporized material is then deposited on the iron workpieces.

The passage 322 is opened. In particular, the partition plate 34 is removed from the passage 322.

The posts 50 with the coated iron workpieces are transferred from the deposition chamber 20 to the preheating chamber 10 and mounted on the support assembly 40 in the preheating chamber 10.

The passage 322 is closed to maintain the deposition chamber 20 in a vacuum state.

The preheating chamber 10 is opened and the coated iron workpieces are removed therefrom.

The steps can be repeated to process subsequent iron workpieces. During the method as disclosed, the deposition chamber 20 maintains a vacuum state so the target material is not oxidized nor contaminated by dust. This increases the coating efficiency and quality.

In addition, if the iron workpieces are dropped on the first bottom 14, the second bottom 24 or the third bottom 321, the magnetic assembly 70 attracts the dropped iron workpieces towards the arm 642 and does not influence the iron workpieces fixed on the posts 50. The arm 642 transfers the dropped iron workpieces into the preheating chamber 10. After the passage 322 is closed, the dropped iron workpieces can be removed from the preheating chamber 10 to secure on the posts 50 for a next coating process. There is no need to break-off the coating process or wait for the coating process to finish. This further increases the coating efficiency.

Figure 6:
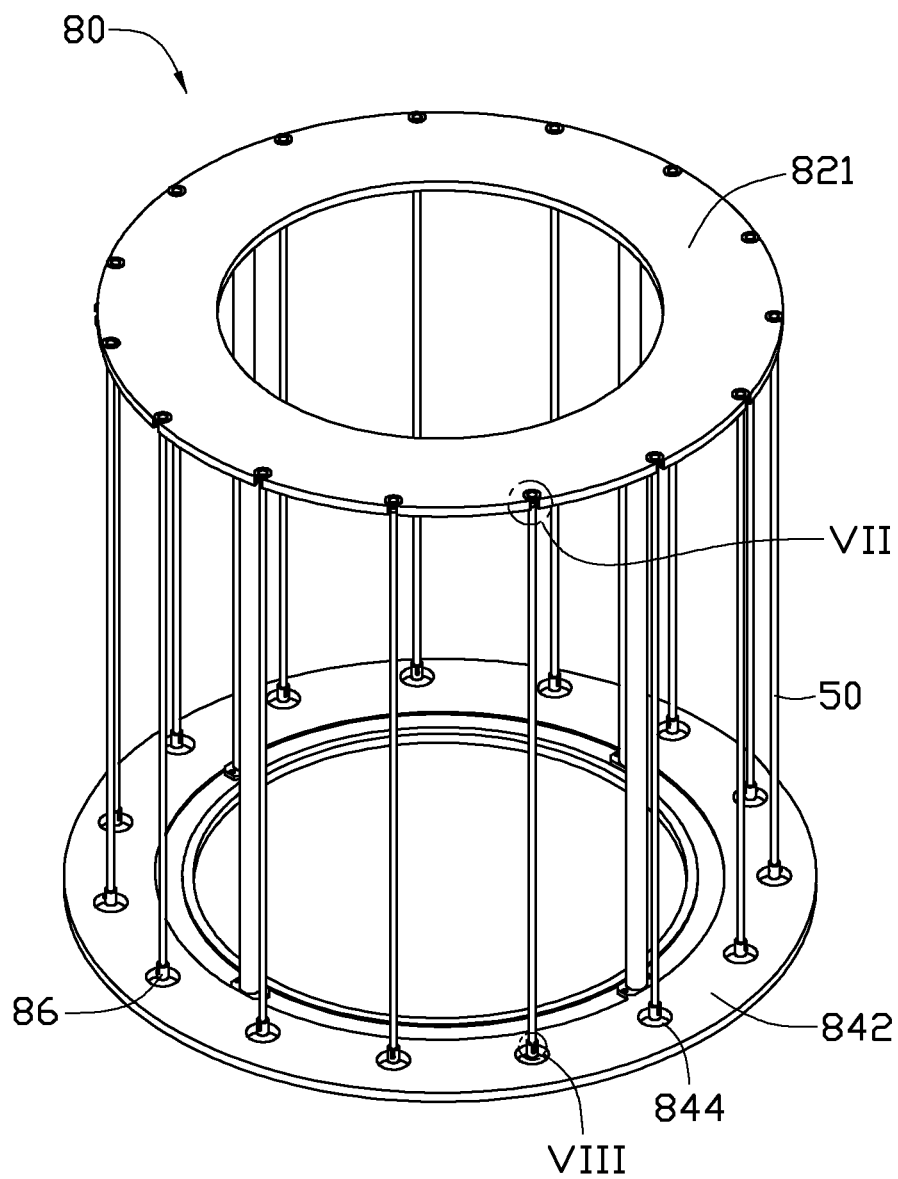
FIG. 6 is a schematic, isometric view of a rotatable assembly with posts, according to a second exemplary embodiment.
Figure 7:
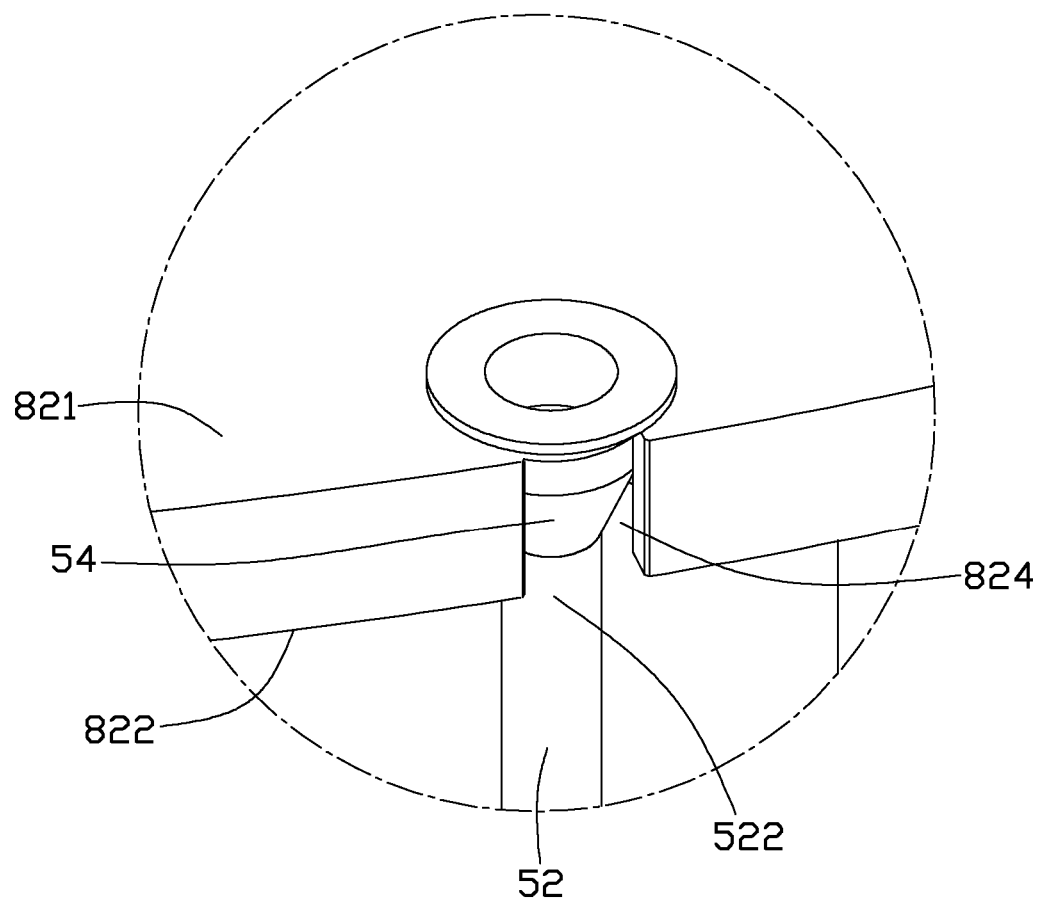
FIG. 7 is an enlarged view of a circled part VII of the rotatable assembly of FIG. 6.
Figure 8:
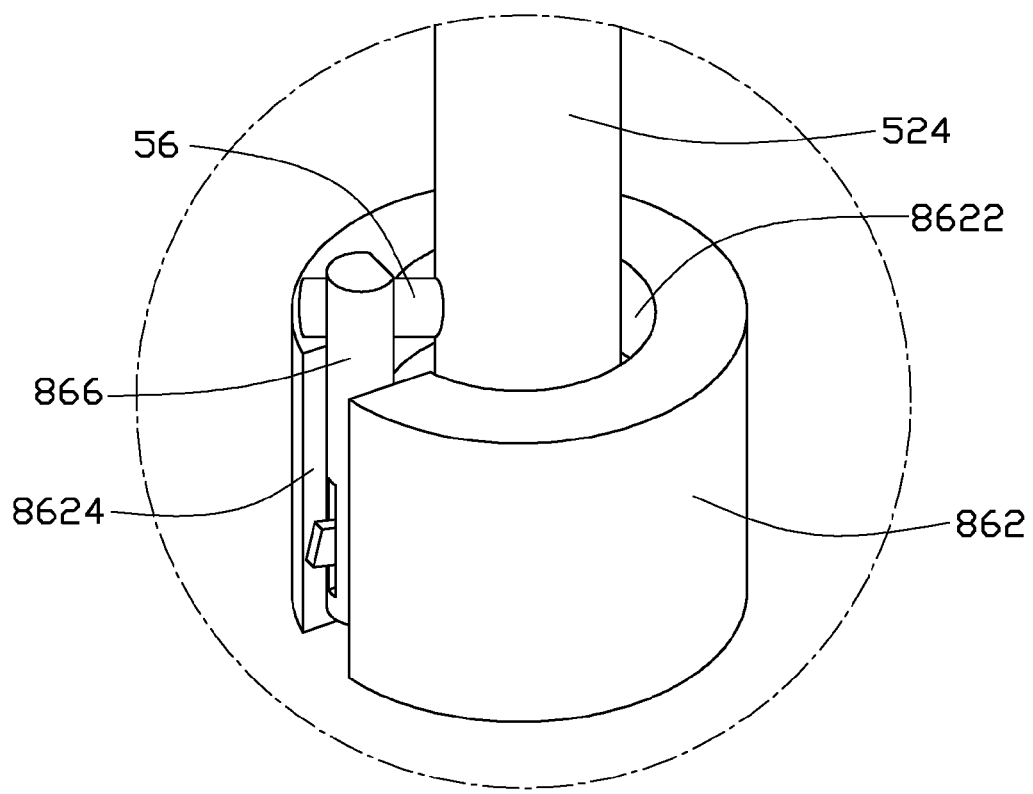
FIG. 8 is an enlarged view of a circled part VIII of the rotatable assembly of FIG. 6.
Figure 9:
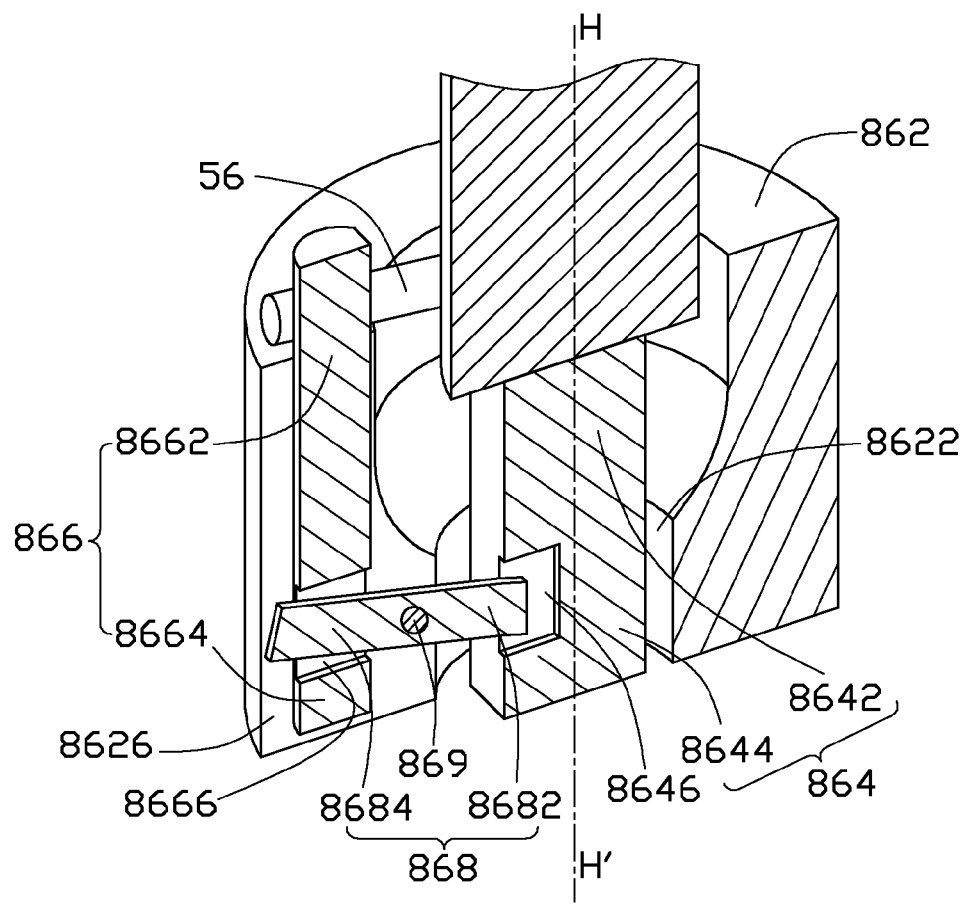
FIG. 9 is a partially, enlarged sectional view of the rotatable assembly of FIG. 6.

Referring to FIG. 6, a rotatable assembly 80 of a sputtering apparatus, according to a second exemplary embodiment, is shown. Referring to FIGS. 7-9, the differences between the rotatable assembly 80 of the second embodiment and the rotatable assembly 40 of the first embodiment is that: each seat member 86 of the rotatable assembly 80 is rotatably received in a corresponding first receiving hole 844. Each seat member 86 includes a receiving post 862, a support post 864, a drive post 866, and a lever bar 868.

The receiving post 862 is received in a corresponding first receiving hole 844 and is rotatable about a longitudinal axis HH' of the receiving post 862. The receiving post 862 defines a second receiving hole 8622. A slot 8624 is defined in a sidewall 8626 surrounding around the second receiving hole 8622 of the receiving post 862.

The support post 864 is received in the second receiving hole 8622 and includes an upper end 8642 and a lower end 8644. The upper end 8642 and the lower end 8644 are at opposite sides of the support post 864. A first engagement hole 8646 is defined in the lower end 8646 of the support post 864.

The drive post 866 is positioned in the slot 8624 and includes an upper portion 8662 and a lower portion 8664. A second engagement hole 8666 is defined in the lower portion 8664 of the drive post 866.

The lever bar 868 is pivotally jointed to the sidewall 8626 in the slot 8624 at middle of the lever bar 868 by a pivot 869. The lever bar 868 includes a first connection end 8682 and a second connection end 8684. The first connection end 8682 and the second connection end 8684 are at opposite sides of the lever bar 868. The first connection end 8682 is pivotally jointed to the lower end 8644 in the first engagement hole 8646. The second connection end 8684 is pivotally jointed to the lower portion 8664 in the second engagement hole 8666. In a natural state, the drive post 866 is totally received in the slot 8624. The support post 864 and the drive post 866 cooperatively make the lever bar 868 maintain a horizontal balance. The lever bar 868 is rotatable about the pivot 869 under pressure of the support post 864 and the drive post 866. In this embodiment, the length of the support post 864 is less than that of the drive post 866.

When the post 50 is mounted on the support assembly 80, the post 50 is lifted to raise the engagement portion 54 above the first surface 821 and to elevate the second end 524 above the receiving post 862. The post 50 is then moved toward the third surface 842 until the engagement portion 54 engages in the cutout 824 and the second end 524 is received in the second receiving hole 8622 to press the support post 864. The support post 864 moves downward to make the lever bar 868 rotate about the pivot 869. The drive post 866 moves upward to be exposed at the receiving post 862. The drive post 866 engages with the protrusion 56. When the receiving post 862 rotates about the longitudinal axis HH', the lever bar 868, the support post 864, and the drive post 866 rotate about the longitudinal axis HH' with the rotation of the receiving post 462. The post 50 rotates about the longitudinal axis HH' as the drive post 866 engages with the protrusion 56. When the post 50 is demounted from the support assembly 80, the post 50 is lifted to raise the engagement portion 54 above the first surface 821 and to elevate the second end 524 above the drive post 866. The post 50 is then radially moved away from the central axis OO' to separate from the support assembly 80. As a result, the mounting and demounting efficiency of the posts 50 is increased.

The advantages of the sputtering apparatus of the second embodiment are similar to those of the sputtering apparatus 10 of the first embodiment.

It is to be understood, however, that even though numerous characteristics and advantages of the present embodiments have been set forth in the foregoing description, together with details of the structures and functions of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A sputtering apparatus comprising:
a preheating chamber;
a deposition chamber;
a passage in communication with the preheating chamber and the deposition chamber;
two support assemblies, one received in the preheating chamber, the other received in the deposition chamber, with each support assembly defining a central axis in the center thereof, about which the support assembly rotates;
each support assembly comprising an upper base, a lower base opposite to the upper base, a plurality of seat members mounted to the lower base opposite to the upper base, and at least two connection posts interconnected between the upper base and the lower base, the upper base comprising a plurality of cutouts defined in a peripheral edge thereof opening toward a direction away from the central axis, the lower base defining a plurality of first receiving holes aligned with the respective cutouts, the seat members rotatably received in the corresponding first receiving holes; and
each seat member comprising a support post received in the corresponding first receiving hole, a support base, and a cylindrical engagement post, the support post and the engagement post aligned with each other and extending from opposite sides of the support base, each engagement post comprising a second receiving hole, a sidewall surrounding the second receiving hole, and a slot defined in the sidewall, each seat member rotatable about a longitudinal axis of the support post;
a plurality of posts capable of detachably mounting on the two support assemblies, each post configured for fixing iron workpieces thereon and being radially moveable away from the central axis to separate from the corresponding support assembly, each post comprising a rod body portion, an engagement portion having a greater size than that of the rod body portion, and a protrusion extending from the rod body portion and engagable in the slot, the rod body portion comprising a first end and an opposite second end, the second end receivingly engaged in the second receiving hole, the engagement portion engaged in the cutout, the protrusion extending from the second receiving hole to the slot, the cutouts and the seat members configured for engaging with the respective posts, each post jointly rotatable with the rotation of the corresponding seat member;
a transferring robot arranged in the preheating chamber, the transferring robot configured for demounting any given one of the posts from a given one of the two support assemblies, transferring the demounted post between the preheating chamber and the deposition chamber, and mounting the transferred post on the other support assembly; and a magnetic assembly fixed on the transferring robot, the magnetic assembly configured for collecting iron workpieces dropped on a bottom in the preheating chamber, the deposition chamber, or the passage.

2. A sputtering apparatus comprising:
a preheating chamber;
a deposition chamber;
a passage in communication with the preheating chamber and the deposition chamber;
two support assemblies, one received in the preheating chamber, the other received in the deposition chamber, with each support assembly defining a central axis in the center thereof, about which the support assembly rotates, each support assembly comprising an upper base, a lower base opposite to the upper base, a plurality of seat members, and at least two connection posts interconnected between the upper base and the lower base, the upper base defining a plurality of cutouts, the seat members rotatably mounted on the lower base and aligned with the cutouts, each seat member comprising a hollow receiving post, a support post moveably and rotatably received in the receiving post, a lever bar pivotably connected to the receiving post, and a drive post, the drive post and the support post coupled to opposite ends of the lever bar, each receiving post being rotatable about a longitudinal axis of the receiving post;
a plurality of posts configured for fixing iron workpieces thereon, the cutouts and the seat members cooperatively and detachably assembling the posts to the two supporting assemblies, each post being radially moveable away from the central axis to separate from the support assembly and being jointly rotatable with the rotation of the corresponding seat member;
a transferring robot arranged in the preheating chamber, the transferring robot configured for demounting any given one of the posts from a given one of the two support assemblies, transferring the demounted post between the preheating chamber and the deposition chamber, and mounting the transferred post on the other support assembly; a magnetic assembly fixed on the transferring robot, the magnetic assembly configured for collecting iron workpieces dropped on a bottom in the preheating chamber, the deposition chamber, or the passage;
wherein each post comprises a rod body portion having a first end and a second end opposite to the first end, an engagement portion at the first end having a greater size than that of the rod body portion, and a protrusion extending from the second end, the engagement portion engages in the cutouts, the second end is received in the receiving post and rests on the support post, and each drive post is configured for abutting against the protrusion of the corresponding post thus driving the post to revolve when the receiving post rotates; and
wherein each seat member further comprises a slot defined in a sidewall of the receiving post, the lever bar is pivotably connected to the receiving post in the slot, and the drive post is arranged in the slot and moves upward to be exposed at the receiving post and abut against the post or moves downward to be totally received in the receiving post.

3. The sputtering apparatus as claimed in claim 2, wherein the cutouts are defined in a peripheral edge of the upper base with each cutout opening toward a direction away from the central axis, the lower base defines a plurality of receiving holes aligned with the respective cutouts, and the seat members are rotatably received in the corresponding receiving holes.

4. The sputtering apparatus as claimed in claim 3, wherein each cutout tapers in the direction away from the central axis, and a horizontal width of each cutout as measured along a radial direction of the upper base decreases along a direction from the upper base to the lower base.

5. The sputtering apparatus as claimed in claim 2, wherein the upper base is an annular planar plate and defines an upper through hole at a center thereof, the lower base is an annular planar plate and defines a lower through hole aligned with the upper through hole, and the transferring robot is passable through the upper through hole and the lower through hole.

6. The sputtering apparatus as claimed in claim 5, wherein the transferring robot comprises a receiving case, a driving member, and two manipulators, the driving member is received in the receiving case and is mechanically and electrically connected to the manipulators, and the manipulators are configured for demounting the any given one of the posts from the given one of the two support assemblies, transferring the demounted post between the preheating chamber and the deposition chamber, and mounting the transferred post on the other support assembly.

7. The sputtering apparatus as claimed in claim 6, wherein each manipulator comprises an arm and a clamp arranged on the arm and configured for clamping the post, the arm is received in the receiving case, the clamp is exposed at the receiving case, the arm is extendable or retractable along a direction perpendicular to the central axis, and the arm is movable along the central axis direction.

8. The sputtering apparatus as claimed in claim 2, further comprising a connection assembly connecting the preheating chamber to the deposition chamber, wherein the connection assembly comprises a connection member and a partition plate moveably coupled to the connection member, the connection member defines the passage and an opening in communication with the passage, and the partition plate is passable through the opening and configured for selectively closing or opening the passage.

9. A sputtering apparatus comprising:
a preheating chamber;
a deposition chamber;
a passage in communication with the preheating chamber and the deposition chamber;
two support assemblies, one received in the preheating chamber, and the other received in the deposition chamber;
each support assembly defining a central axis in the center thereof, about which the support assembly rotates, each support assembly comprising an upper base, a lower base opposite to the upper base, a plurality of seat members mounted to the lower base opposite to the upper base, and at least two connection posts interconnected between the upper base and the lower base;
the upper base being an annular planar plate and comprising a plurality of cutouts defined in a peripheral edge thereof opening toward a direction away from the central axis and an upper through hole defined at a center thereof; and
the lower base being an annular planar plate defining a plurality of first receiving holes aligned with the respective cutouts and a lower through hole aligned with the upper through hole, the seat members rotatably received in the corresponding first receiving holes;

a plurality of posts capable of detachably mounting on the two support assemblies, each post configured for fixing iron workpieces thereon and being radially moveable away from the central axis to separate from the corresponding support assembly, the cutouts and the seat members configured for engaging with the respective posts;

a transferring robot passable through the upper through hole and the lower through hole and arranged in the preheating chamber, the transferring robot comprising a receiving case, a driving member, and two manipulators, the driving member received in the receiving case and mechanically and electrically connected to the manipulators, the manipulators configured for demounting any given one of the posts from a given one of the two support assemblies, transferring the demounted post between the preheating chamber and the deposition chamber, and mounting the transferred post on the other support assembly; and a magnetic assembly fixed on the transferring robot, the magnetic assembly configured for collecting iron workpieces dropped on a bottom in the preheating chamber, the deposition chamber, or the passage.

10. The sputtering apparatus as claimed in claim 9, wherein each manipulator comprises an arm and a clamp arranged on the arm and configured for clamping the post, the arm is received in the receiving case, the clamp is exposed at the receiving case, the arm is extendable or retractable along a direction perpendicular to the central axis, and the arm is movable along the central axis direction.

* * * * *